United States Patent [19]

Sakurai

[11] Patent Number: 5,731,953
[45] Date of Patent: Mar. 24, 1998

[54] CONTROL UNIT FOR VEHICLE AIR-CONDITIONER SYSTEM

[75] Inventor: Yoshihiko Sakurai, Ohsato-gun, Japan

[73] Assignee: Zexel Corporation, Tokyo, Japan

[21] Appl. No.: 736,584

[22] Filed: Oct. 24, 1996

[30] Foreign Application Priority Data

Nov. 1, 1995 [JP] Japan .................. 7-306407

[51] Int. Cl.$^6$ .................................... H05K 7/20
[52] U.S. Cl. ........................ 361/695; 236/DIG. 19
[58] Field of Search .................. 236/DIG. 19; 361/688, 361/690, 691, 694, 695, 715, 719

[56] References Cited

U.S. PATENT DOCUMENTS

| | | | |
|---|---|---|---|
| 4,824,013 | 4/1989 | Gouldey | 236/DIG. 19 |
| 5,008,775 | 4/1991 | Schindler et al. | 236/DIG. 19 |
| 5,364,025 | 11/1994 | Terry | 236/DIG. 19 |
| 5,484,012 | 1/1996 | Hiratsuka | 361/695 |

FOREIGN PATENT DOCUMENTS

| | | | |
|---|---|---|---|
| 3-73207 | 7/1991 | Japan . | |
| 4-114809 | 10/1992 | Japan . | |
| 6-22416 | 1/1994 | Japan | 361/695 |
| 7-34747 | 8/1995 | Japan . | |

*Primary Examiner*—William E. Tapolcai
*Attorney, Agent, or Firm*—Pollock, Vande Sande & Priddy

[57] ABSTRACT

A control unit for a vehicle air-conditioner system of the type incorporating an in-car sensor and an aspirator fan has a circuit board mounted in a casing equipped with a control panel, an aspirator fan for sucking passenger compartment air into the casing through an air intake in the panel is provided on the circuit board, and a detection element for detecting vehicle passenger compartment temperature is attached to the circuit board to be disposed in the flow path of the passenger compartment air sucked in through the air intake. Some or all necessary components requiring cooling are disposed in the flow path at points downstream of the detection element.

10 Claims, 4 Drawing Sheets

CONTROL UNIT FOR VEHICLE AIR-CONDITIONER SYSTEM

BACKGROUND OF THE INVENTION

1. Field of the Invention

The present invention relates to a control unit for a vehicle air-conditioner system, more particularly to such a control unit which has a built-in temperature detecting element for detecting passenger compartment temperature and a built-in aspirator fan.

2. Prior Art

As seen in Japanese Utility Model Application Public Disclosure No. Hei 3-73207, for example, most automatic vehicle air-conditioning systems of recent years are configured to have both an in-car sensor, such as a thermistor, for detecting passenger compartment temperature and an aspirator accommodated in a housing provided for this purpose. The conventional configuration inevitably increases system cost, however, owing to the need to provide a dedicated circuit board for connection of the in-car sensor and the aspirator, along with a separate case specifically for housing the circuit board.

Japanese Utility Model Application Public Disclosure No. Hei 4-114809 teaches a configuration intended to overcome this drawback, specifically to reduce cost and enhance installation performance by providing a box for feeding passenger compartment air to the vehicle control panel such that a box main body constituting a constituent element of the box is formed integrally with the control panel, installing a cover member on the box main body, and integrally incorporating the in-car sensor and the aspirator (constituted of a fan, a drive circuit provided on the cover member and the like) in the so-configured box. However, this arrangement utilizes the control panel as only one portion of the aspirator case and therefore achieves only a very small cost reduction, and even this slight advantage is more than offset by an increase in the number of control panel assembly steps required.

On the other hand, Japanese Utility Model Application Public Disclosure No. Hei 7-34747, which relates to an aspirator for detecting passenger compartment temperature of the type in which a temperature sensor for detecting the temperature of the air flow produced by a motor-driven fan for sucking in passenger compartment air is mounted on an aspirator frame, teaches a configuration for simplifying the wiring arrangement and facilitating handling and assembly by forming the connector terminals for connection to the motor power source and the connector terminals for connection to the temperature sensor control circuit so as to project from the outer surface of the aspirator frame, thereby enabling these connector terminals to be directly connected to the wiring formed on a printed circuit board provided on the back of an operation panel in the passenger compartment. Although this configuration is advantageous in enabling the circuit board of the terminal section to co-utilize the control panel, it inevitably increases the number of harnesses and terminals required between the control panel and the control unit. The overall cost reduction is therefore small.

SUMMARY OF THE INVENTION

One object of the present invention is to provide a control unit for a vehicle air-conditioner system which is capable of overcoming the aforesaid problems of the prior art.

Another object of the invention is to provide a control unit for a vehicle air-conditioner system of the type incorporating an in-car sensor and an aspirator fan, more particularly to provide such a control unit which can be manufactured at a much lower cost than conventional control units of this type.

For achieving these objects, this invention provides a vehicle air-conditioner system control unit having a circuit board mounted in a casing equipped with a control panel, characterized in that an aspirator fan for sucking passenger compartment air into the casing through an air intake formed in the control panel and a drive circuit for driving the aspirator fan are provided on the circuit board, a detection element for detecting the passenger compartment temperature is attached to the circuit board to be disposed in a flow path of the passenger compartment air sucked in through the air intake, and some or all necessary components requiring cooling are disposed in the flow path at points downstream of the detection element.

The components requiring cooling include, for example, resistors which pass relatively large amounts of current, transistors, integrated circuit elements, heat radiators and the like. In order to stabilize the flow path of the passenger compartment air drawn in through the air intake by the aspirator fan, it is effective to provide a duct or housing between the air intake and the aspirator fan. The components requiring cooling are preferably disposed immediately downstream of the aspirator fan.

Since rotation of the aspirator fan causes passenger compartment air to be sucked into the casing through the air intake, the temperature of the detection element disposed in the so-produced passenger compartment air flow path becomes the same as the passenger compartment temperature, thereby enabling detection of the passenger compartment temperature. In addition, the resistors, transistors, heat radiators and the like located downstream of the detection element can be forcibly cooled by the air flow.

The invention will be better understood and other objects and advantages thereof will be more apparent from the following detailed description of preferred embodiments with reference to the accompanying drawings.

DETAILED DESCRIPTION OF THE PREFERRED EMBODIMENT

Figure 1:
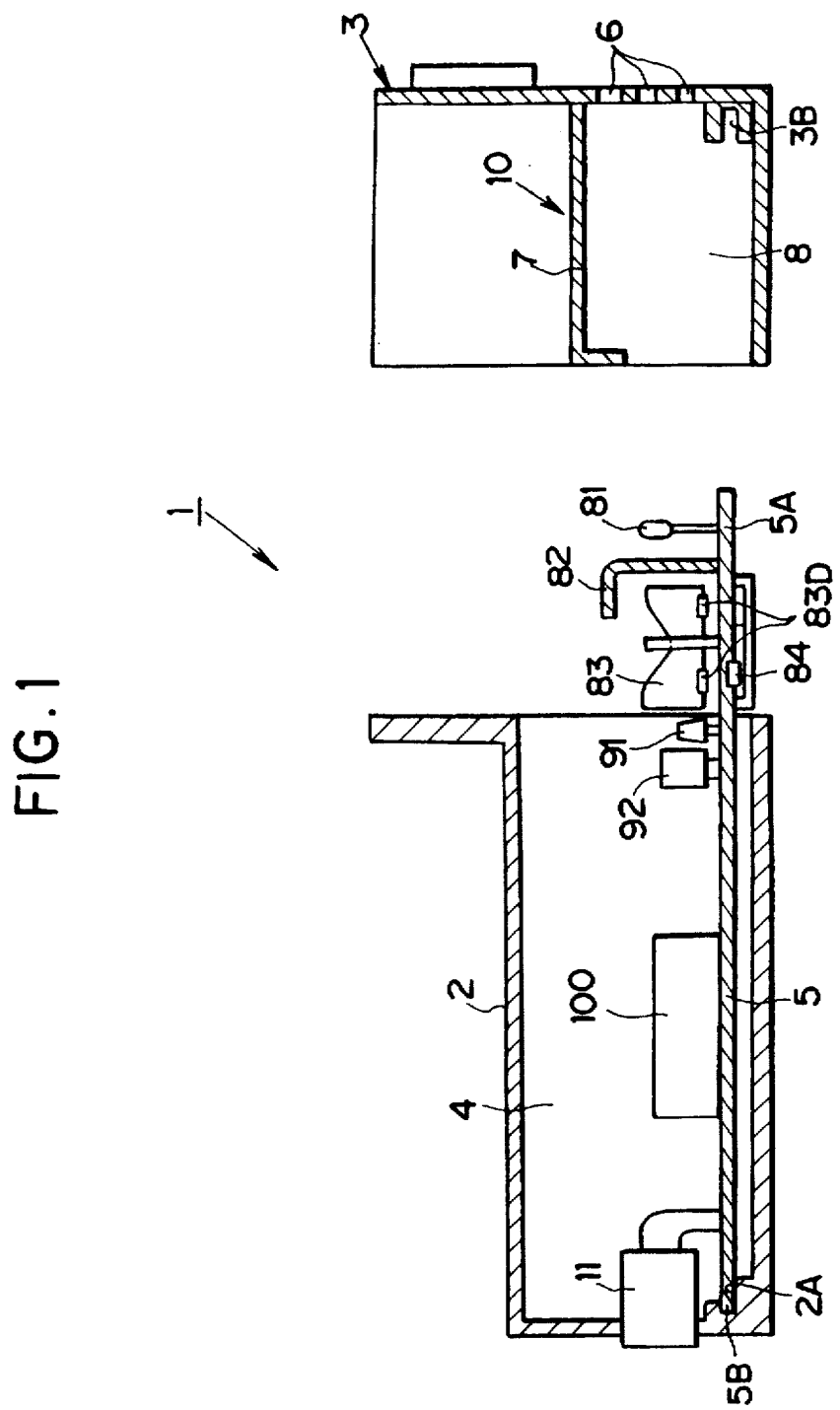
FIG. 1 is a sectional view showing, as partially disassembled, a control unit for a vehicle air-conditioner system constituted according to this invention.
Figure 2:
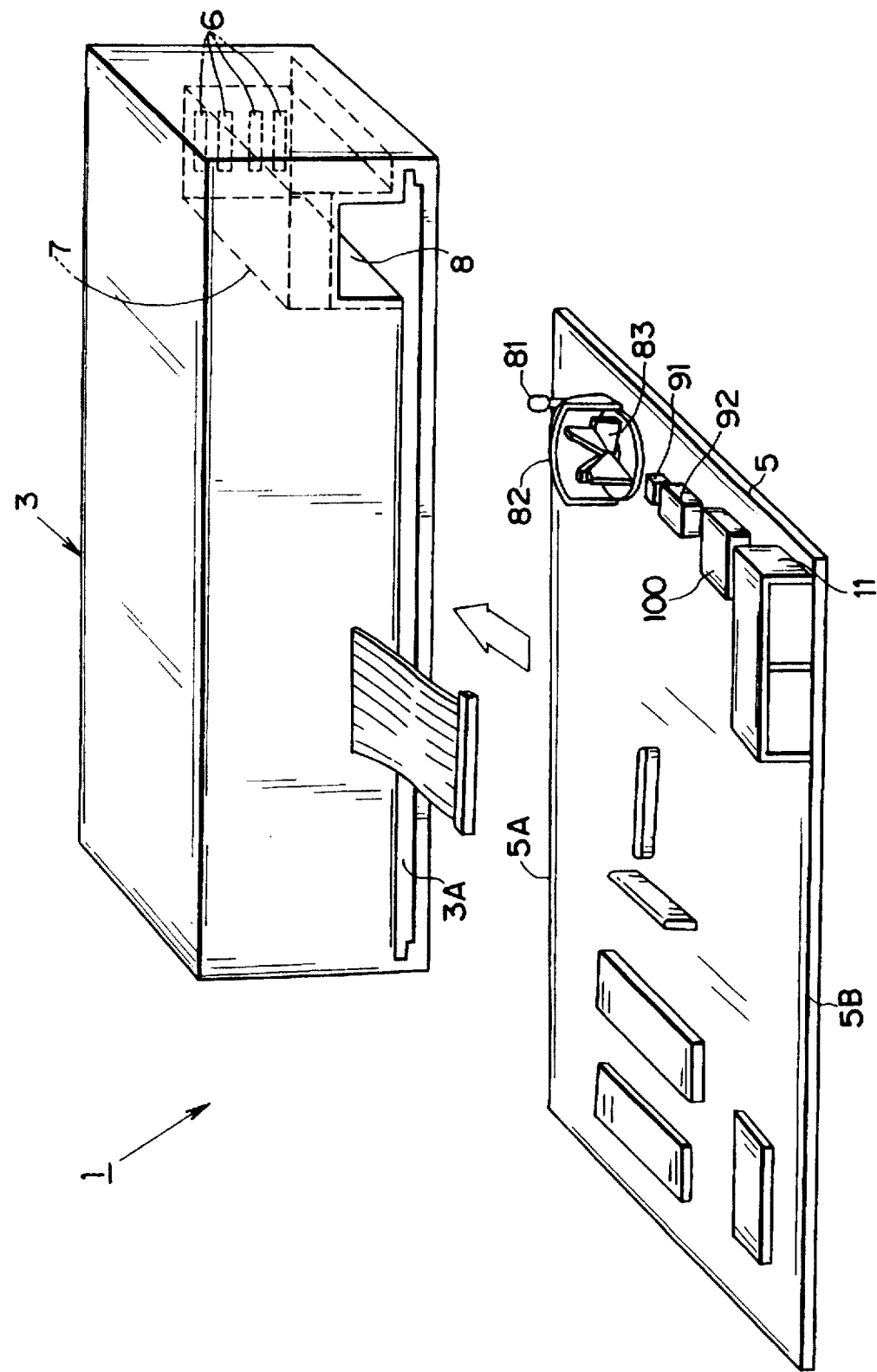
FIG. 2 is perspective view showing the control unit of FIG. 1 as partially disassembled.

FIGS. 1 and 2 are a sectional view and a perspective showing a partially disassembled control unit 1 for vehicle air-conditioner system constituted according to this invention. The control unit 1, which controls the main unit (not shown) of the vehicle air-conditioner system, has a case main body 2 and a control panel section 3 mounted on the front of the case main body 2. The control panel section 3 is equipped with various operation switches for use by, for instance, the vehicle operator. A circuit board 5 is accommodated in a housing space 4 formed by joining the case main body 2 and the control panel section 3.

Figure 3:
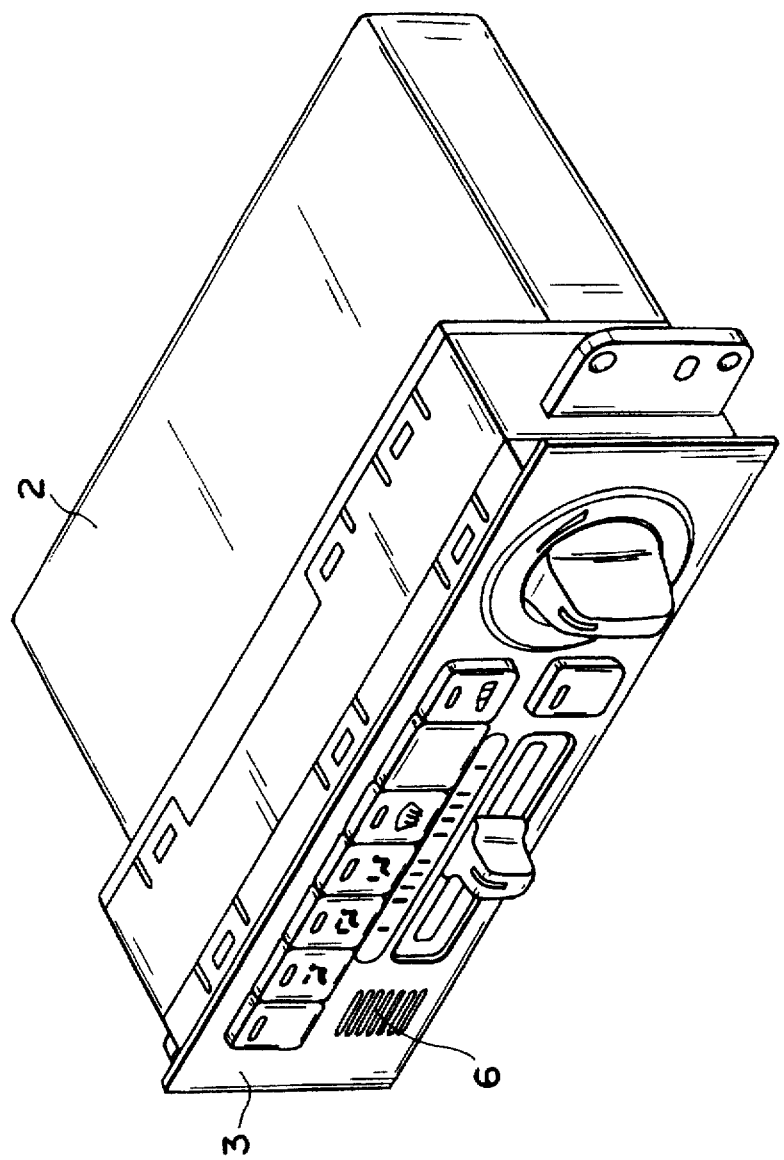
FIG. 3 is a perspective view showing the appearance of the control unit of FIG. 1 as completely assembled.

In the assembled state with the control panel section 3 fastened to the case main body 2 by conventional fastening means (not shown), the front edge portion 5A of the circuit board 5 passes through a slit 3A in the lower back of the control panel section 3 and fits into a slotted portion 3B formed in the control panel section 3. On the other hand, the rear edge portion 5B fits into a slotted portion 2A in the case main body 2. The circuit board 5 is thus fixed at the prescribed position in the housing space 4 formed by the case main body 2 and the control panel section 3. Although the circuit board 5 is configured with a control circuit for controlling the main unit of the vehicle air-conditioning system, the circuit is of conventional design and is for the most part omitted from FIG. 1. FIG. 3 is a perspective view of the control unit 1 after assembly.

Air is constantly drawn into the control unit 1 through an air intake 6 consisting of slits formed in the control panel section 3. A thermistor serving as the passenger compartment temperature detection element of an aspirator apparatus 10 is disposed in the so-formed passenger compartment air flow path. For this, a relatively small chamber 8 is defined inside the control panel section 3 by a partition 7. As shown in the figure, the portion of the circuit board 5 to reside in the chamber 8 when the control unit 1 is fully assembled is provided with the thermistor 81, a shield plate 82, an aspirator fan 83 having permanent magnets 83D attached to its undersurface, and a set of drive coils 84 for rotating the aspirator fan 83 in cooperation with the permanent magnets 83D, thereby constituting the aspirator apparatus 10. Reference numeral 11 designates a connector for electrically connecting the circuit board 5 with required external circuitry.

Figure 4:
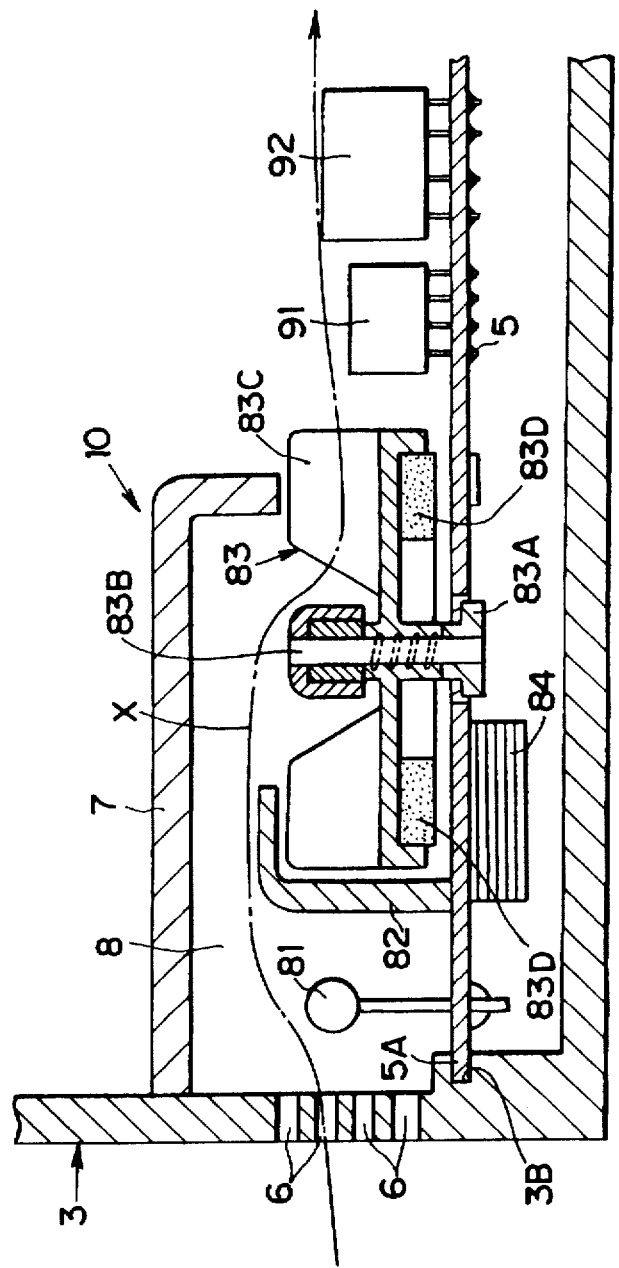
FIG. 4 is an enlarged view showing the detailed structure of an aspirator apparatus configured on a circuit board of the control unit of FIG. 1.

FIG. 4 is an enlarged view showing the detailed structure of the aspirator apparatus 10 formed on the circuit board 5. The thermistor 81 is soldered to the circuit board 5 so as to be located near the air intake 6 and to complete the required electrical connection at the same time. The aspirator fan 83 has a blade member 83C rotatably retained on an upright fixed shaft 83B firmly anchored to a base 83A fastened to the circuit board 5 by bonding, screw attachment or other appropriate means. The permanent magnets 83D are attached to the undersurface of the blade member 83C at regular intervals in the circumferential direction. The set of drive coils 84 is bonded, screwed or otherwise attached by conventional means to the undersurface of the circuit board 5 at locations over which the permanent magnets 83D pass during rotation of the aspirator fan 83. The blade member 83C is rotated by supplying drive current to the set of drive coils 84 from a conventional drive circuit 100 for the aspirator fan 83 provided on the circuit board 5.

The shield plate 82 is fastened to the circuit board 5 between the thermistor 81 and the aspirator fan 83 so as to cover a portion of the aspirator fan 83. As a result, passenger compartment air drawn in through the air intake 6 owing to the rotation of the blade member 83C of the aspirator fan 83 forms a passenger compartment air flow path in the chamber 8 as indicated by the arrow X.

In order to effectively utilize the air flow produced by the rotation of the aspirator fan 83 after it exits the chamber 8, those of the components attached to the circuit board 5 which require cooling are disposed downstream of the aspirator fan 83. In the illustrated embodiment, a power source regulator IC element 91 and a drive IC element 92 for driving the actuators of door motors and the like are disposed near the outlet of the chamber 8.

When prescribed drive current is supplied to the set of drive coils 84 to rotate the blade member 83C and suck passenger compartment air into the chamber 8 through the air intake 6, therefore, the temperature of the thermistor 81 becomes the same as the passenger compartment temperature, while temperature increase of the regulator IC element 91 and the drive IC element 92 can be suppressed by forced cooling of these components.

Since the control unit 1 is configured in the foregoing manner, no separate case or circuit board is required exclusively for the aspirator fan and no harness or connector is required between the aspirator fan and the control unit. The invention therefore not only reduces cost but also achieves a marked improvement in reliability by eliminating the possibility of malfunction owing to breakage of harness wires or poor electrical contact at a connector. Moreover, since the use of the air stream produced by the aspirator fan for cooling makes it possible to eliminate or reduced the size of the heat radiators of the components that tend to rise greatly in temperature, a further reduction in the size of the control unit can be realized. This effect is particularly great in the case of a control unit which operates off of a 24 V power supply, since the power source regulators of such units tend to experience large temperature increases.

What is claimed is:

1. A control unit for a vehicle air-conditioner system comprising:

a casing equipped with a control panel, a circuit board mounted in the casing and having components thereon requiring cooling, an air intake formed in the control panel, an aspirator fan provided on the circuit board for sucking air from a vehicle passenger compartment into the casing through the air intake, multiple permanent magnets provided at prescribed intervals on an undersurface of the aspirator fan, a set of drive coils attached to an undersurface of the circuit board at locations over which the permanent magnets pass, a detection element for detecting passenger compartment temperature attached to the circuit board and disposed in a path of a flow of passenger compartment air to be produced in the casing by the aspirator fan, said detection element being disposed in a portion of said air flow path between the air intake and the aspirator fan, and a drive circuit for the aspirator fan provided on the circuit board, said components requiring cooling being disposed in the air flow path at points downstream of the detection element.

2. A control unit as claimed in claim 1, wherein the aspirator fan includes a base fastened to the circuit board and a blade member rotatably retained on the base.

3. A control unit as claimed in claim 1, wherein all of said components are disposed on an outlet side of the aspirator fan.

4. A control unit as claimed in claim 1, further comprising a shield plate fixed to the circuit board on the air intake side of the aspirator fan so as to cover a portion of the aspirator fan.

5. A control unit as claimed in claim 4, wherein the detection element is disposed between the shield plate and the air intake.

6. A control unit as claimed in claim 1, further comprising a partition provided in a control panel section to define a chamber enclosing the aspirator fan and the detection element, the air flow path being formed to pass through the chamber.

7. A control unit as claimed in claim 1, wherein at least some of said components are disposed on an outlet side of the aspirator fan.

8. A control unit as claimed in claim 6, wherein the flow of passenger compartment air exiting the chamber cools at least some of said components.

9. A control unit as claimed in claim 6, wherein the flow of passenger compartment air exiting the chamber cools all of said components.

10. A control unit as claimed in claim 6, wherein said components are housed in a case body fastened to said control panel section.

* * * * *